United States Patent
Cheng et al.

(10) Patent No.: US 7,821,373 B2
(45) Date of Patent: Oct. 26, 2010

(54) SURFACE MOUNT MAGNETIC DEVICE AND PLACEMENT METHOD THEREOF

(75) Inventors: Jui-Chu Cheng, Taoyuan Hsien (TW); Chen-En Liao, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 12/414,522

(22) Filed: Mar. 30, 2009

(65) Prior Publication Data

US 2010/0201470 A1 Aug. 12, 2010

(30) Foreign Application Priority Data

Feb. 9, 2009 (TW) .............................. 98104113 A

(51) Int. Cl.
*H01F 5/00* (2006.01)
(52) U.S. Cl. ..................................... 336/200
(58) Field of Classification Search ................... 336/65, 336/90, 92, 96, 200, 232
See application file for complete search history.

(56) References Cited

U.S. PATENT DOCUMENTS

| | | | |
|---|---|---|---|
| 4,939,494 A * | 7/1990 | Masuda et al. ................. 336/96 |
| 5,034,854 A * | 7/1991 | Matsumura et al. ......... 361/744 |
| 5,264,815 A * | 11/1993 | Umeya et al. .................. 336/96 |
| 5,534,839 A * | 7/1996 | Mackin et al. ............... 336/192 |
| 5,977,855 A * | 11/1999 | Matsumura et al. ........... 336/96 |
| 6,031,442 A * | 2/2000 | Nakazawa .................... 336/96 |
| 6,690,254 B2 * | 2/2004 | McGrane et al. .............. 336/90 |
| 6,788,181 B2 * | 9/2004 | Yeh et al. .................... 336/192 |
| 6,876,555 B2 * | 4/2005 | Matsumoto et al. ......... 361/782 |
| 7,583,011 B2 * | 9/2009 | Kami et al. .................. 310/348 |

\* cited by examiner

*Primary Examiner*—Tuyen Nguyen
(74) *Attorney, Agent, or Firm*—Kirton & McConkie; Evan R. Witt

(57) ABSTRACT

The surface mount magnetic device includes a magnetic element and as planar cover. The magnetic element includes a winding structure and a magnetic core. The planar cover is attached on the magnetic element. When a nozzle at a tip of placement head of a placement machine is placed on a top surface of the planar cover, the nozzle is tightly attached on the top surface of the planar cover. The surface mount magnetic device is vacuum picked up by the placement head due to pneumatic suction of a driving device, so that the surface mount magnetic device is transported from a first position to a second position.

10 Claims, 5 Drawing Sheets

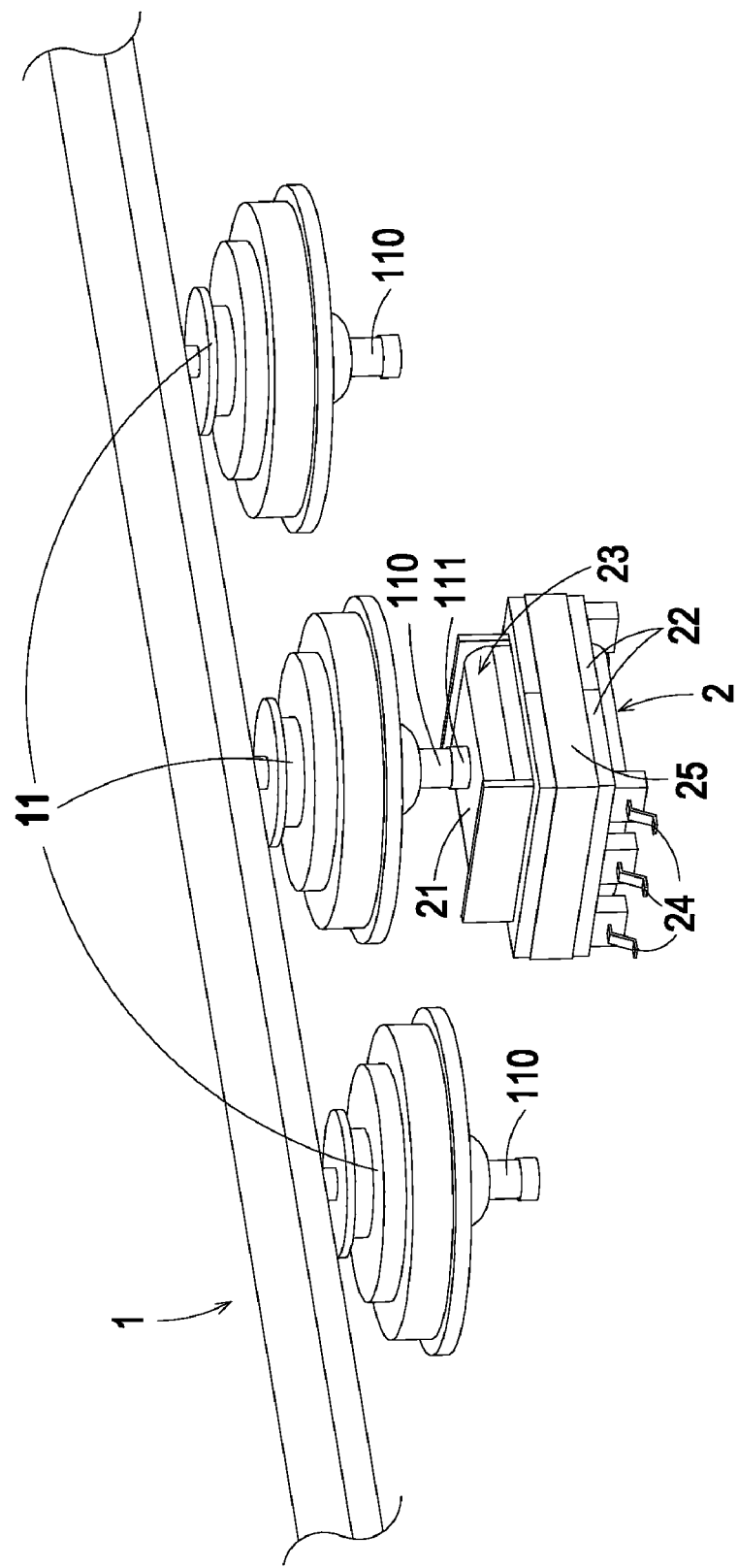

SURFACE MOUNT MAGNETIC DEVICE AND PLACEMENT METHOD THEREOF

FIELD OF THE INVENTION

The present invention relates to a magnetic device, and more particularly to a surface mount magnetic device. The present invention also relates to a placement method of the surface mount magnetic device.

BACKGROUND OF THE INVENTION

Magnetic elements such as inductors and transformers are widely used in many electronic apparatuses such as power supply apparatuses or power adapters. Since the power supply apparatuses or power adapters are developed toward minimization and high power, the volumes of the magnetic devices for use in these electronic apparatuses are gradually reduced and the shapes thereof become flatter. Moreover, the magnetic element can be directly arranged on a circuit board according to a surface mount technology (SMT), and thus such a magnetic element is also referred as a surface mount magnetic device. For increasing throughput and yield, the surface mount magnetic device is mounted on the circuit board by an automatic placement process according to the surface mount technology (SMT).

A conventional automatic placement process will be illustrated as follows. First of all, multiple surface mount magnetic devices are successively transported to a specified zone by a feeding machine. Then, the surface mount magnetic devices are picked by an automatic placement machine and then placed on predetermined locations of the circuit board that have been previously coated with solder paste. Then, the circuit board and the surface mount magnetic devices are heated in a reflow furnace to melt the solder paste. Afterwards, the circuit board is cooled to solidify the solder paste so as to securely attach the surface mount magnetic devices onto the circuit board. As known, the step of placing the surface mount magnetic devices on the circuit board is very important. If the sequence of placing the surface mount magnetic devices is improper or the surface mount magnetic devices are not precisely placed on the contact pads, the assembling time is increased and the yield is reduced.

FIG. 1 is a schematic view illustrating a placement machine for placing a surface mount magnetic device on a circuit board according to the prior art. The placement machine 1 has a plurality of placement heads 11. These placement heads 11 have individual tubes 110, which are communicated with a driving device such as a vacuum pump (not shown). In addition, nozzles 111 are disposed at the tips of respective tubes 110. For picking up surface mount magnetic devices 2, the placement heads 11 are horizontally and vertically moved to locations above corresponding surface mount magnetic devices 2 such that the nozzles 111 are aligned with corresponding surface mount magnetic devices 2. For clarification and brevity, only a surface mount magnetic device 2 is shown in the drawings. Due to pneumatic suction of the vacuum pump, the nozzles 111 can vacuum suck the top surface 21 of the surface mount magnetic device 2 such that the surface mount magnetic device 2 is picked by the placement head 11. Next, the placement head 11 is moved until the nozzle 111 is aligned with a contact pad of a circuit board (not shown). Next, the vacuum pump inhales air to the tube 110 such that the surface mount magnetic device 2 is detached from the nozzle 111. Meanwhile, the surface mount magnetic device 2 is placed on the contact pad of the circuit board.

FIG. 2A is a schematic top view of the surface mount magnetic device as shown in FIG. 1. FIG. 2B is a schematic cross-sectional view of the surface mount magnetic device as shown in FIG. 1. As shown in FIG. 2A and FIG. 2B, the surface mount magnetic device 2 is substantially a magnetic element including two magnetic cores 22 and a winding structure 23. The winding structure 23 is enclosed by the magnetic cores 22. The winding structure 23 is produced by winding coils (not shown) on a bobbin 232 and then sheltering an insulating layer 231 around the coils. In addition, a fixing frame 25 is sheathed around the outer surface of the magnetic cores 22 so as to fix the magnetic cores 22. In a case that too many turns of coils are wound on the bobbin 232, the winding structure 23 is located at a higher level than the magnetic cores 22 with respect to the circuit board (not shown). Furthermore, if the fill adhesive or the assembly adhesive (not shown) is protruded from the top surface 21 of the magnetic element 2 or the coils are not equally wound around the bobbin 232, the top surface 21 of the magnetic element 2 is usually an uneven surface. Under this circumstance, the nozzle 110 of the placement head 11 fails to vacuum suck up the top surface 21 of the magnetic element 2 because it is difficult to create a vacuum seal condition between the top surface 21 and the nozzle 110. The insufficient pneumatic suction of the vacuum pump usually results in a component disposal. At this time, the production line is stopped and the pick and place task needs to be done again.

Please refer to FIG. 2A again. The surface mount magnetic device 2 further includes multiple pins 24. A first end of the pin 24 is connected with the winding structure 23. A second end of the pin 24 is disposed on a predetermined contact pad of the circuit board that has been previously coated with solder paste. Then, the circuit board and the surface mount magnetic device 2 are heated in a reflow furnace to melt the solder paste. Afterwards, the circuit board is cooled to solidify the solder paste so as to securely attach the surface mount magnetic device 2 onto the circuit board. After the surface mount magnetic device 2 is mounted onto the circuit board, the surface mount magnetic device 2 is also electrically connected with the circuit board. Since the volume of the surface mount magnetic device 2 is very small, the pin positions of the pins 24 and the polarity of the surface mount magnetic device 2 are difficult to be recognized. If the direction or the polarity of the surface mount magnetic device 2 is erroneous, the placement method fails to be normally operated.

Moreover, since the area of the top of the surface mount magnetic device is very small, it is difficult to label a model number on the surface mount magnetic device and the manufacturer fails to recognize the surface mount magnetic device. Under this circumstance, a material confusion problem occurs. In addition, since the area of the top of the surface mount magnetic device is very small, the nozzle of the placement machine fails to effectively suck up the surface mount magnetic device and transport the surface mount magnetic device to the predetermined position of the circuit board. In most situations, the surface mount magnetic device needs to be manually placed on the circuit board by tweezers. In other words, the conventional surface mount magnetic device is labor-intensive and time-consuming.

There is a need of providing a surface mount magnetic device and a placement method of the surface mount magnetic device so as to obviate the drawbacks encountered from the prior art.

SUMMARY OF THE INVENTION

It is an object of the present invention to provide a surface mount magnetic device having a flat top surface, thereby creating a vacuum seal condition between the flat top surface and the nozzle of the placement head of the placement machine and reducing the component disposal problem.

An object of the present invention provides a surface mount magnetic device, in which one or more marks are formed on the flat top surface of the surface mount magnetic device to indicate the model number, the pin position and/or the polarity of the surface mount magnetic device.

A further object of the present invention provides a placement method of the surface mount magnetic device of the present invention.

In accordance with an aspect of the present invention, there is provided a surface mount magnetic device to be picked up by a placement machine according to a surface mount technology. The surface mount magnetic device includes a magnetic element and a planar cover. The magnetic element includes a winding structure and a magnetic core. The planar cover is attached on the magnetic element. When a nozzle at a tip of a placement head of the placement machine is placed on a top surface of the planar cover, the nozzle is tightly attached on the top surface of the planar cover. The surface mount magnetic device is vacuum picked up by the placement head due to pneumatic suction of a driving device, so that the surface mount magnetic device is transported from a first position to a second position.

In accordance with another aspect of the present invention, there is provided a placement method for use with a surface mount technology. The placement method includes steps of (a) providing a magnetic element including a winding structure and a magnetic core, (b) attaching a planar cover on the magnetic element, thereby assembling a surface mount magnetic device, (c) providing a placement machine having placement head, and placing a nozzle at the placement head on a top surface of the planar cover of the surface mount magnetic device, (d) actuating a driving device that is communicating with the nozzle, so that the surface mount magnetic device is vacuum picked up by the placement head due to pneumatic suction of the driving device, and (e) moving the placement head from a third position to a fourth position, so that the surface mount magnetic device is moved from a first position to a second position.

The above contents of the present invention will become more readily apparent to those ordinarily skilled in the art after reviewing the following detailed description and accompanying drawings, in which:

BRIEF DESCRIPTION OF THE DRAWINGS

FIG. 1 is a schematic view illustrating a placement machine for placing a surface mount magnetic device on a circuit board according to the prior art;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
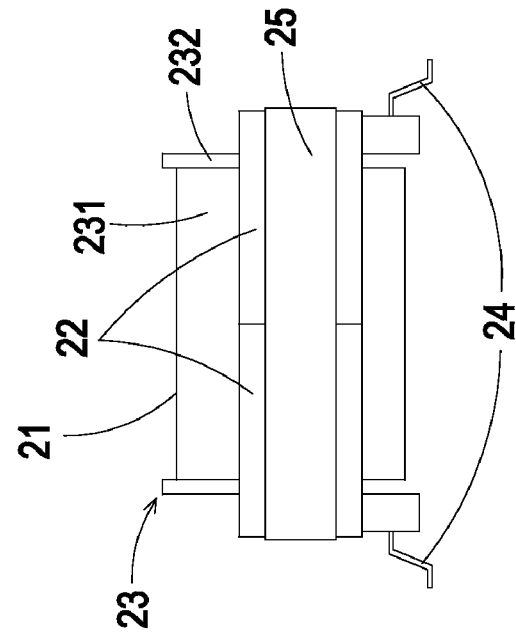
FIG. 2A is a schematic top view of the surface mount magnetic device as shown in FIG. 1.
Figure 2B:
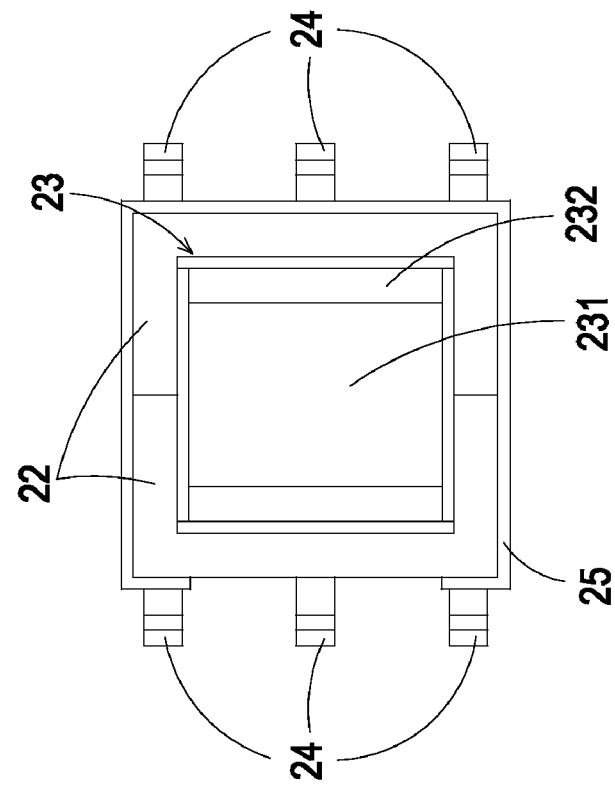
FIG. 2B is a schematic cross-sectional view of the surface mount magnetic device as shown in FIG. 1.
Figure 3B:
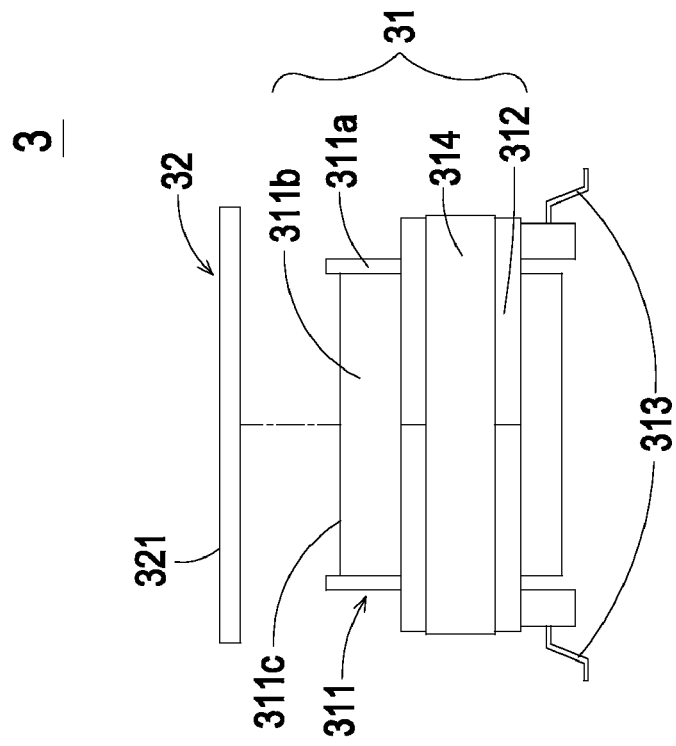
FIG. 3B is a schematic cross-sectional view of the surface mount magnetic device according to the first embodiment of the present invention.
Figure 3A:
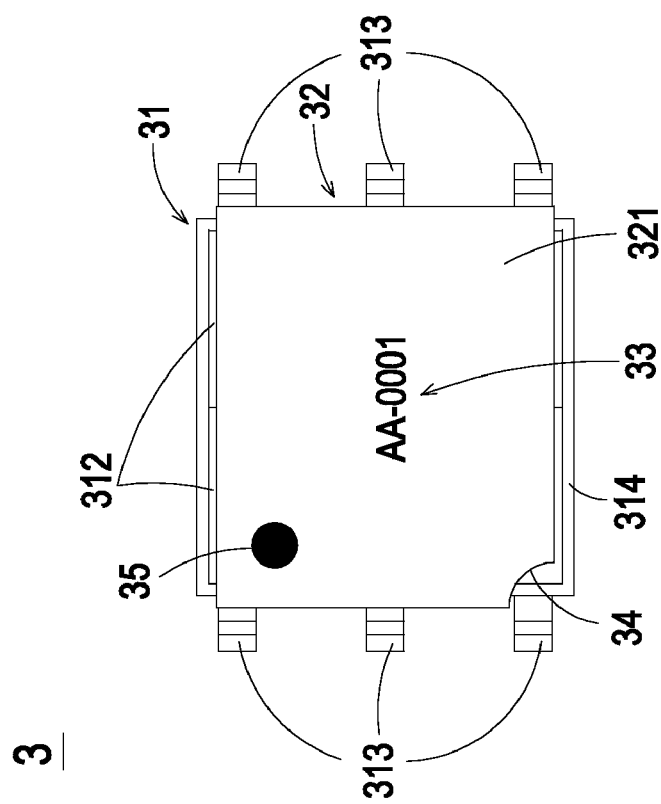
FIG. 3A is a schematic top view illustrating a surface mount magnetic device according to a first embodiment of the present invention.

FIG. 3A is a schematic top view illustrating a surface mount magnetic device according to a first embodiment of the present invention. FIG. 3B is a schematic cross-sectional view of the surface mount magnetic device according to the first embodiment of the present invention. The surface mount magnetic device 3 principally comprises a magnetic element 31 and a planar cover 32. The magnetic element 31 includes a winding structure 311 and two magnetic cores 312. The planar cover 32 is attached on the magnetic element 31.

The magnetic element 31 includes a winding structure 311 and two magnetic cores 312. The winding structure 311 is produced by winding coils (not shown) on a bobbin 311a and then sheltering an insulating layer 311b around the coils. In this embodiment, the magnetic cores 312 are for example EE magnetic cores and collectively enclose the winding structure 311. In addition, a fixing frame 314 is sheathed around the outer surface of the magnetic cores 312 so as to fix the magnetic cores 312. The magnetic element 31 further includes multiple pins 313. A first end of the pin 313 is connected with the bobbin 311a of the winding structure 311 and extended from a position under the magnetic cores 312. A second end of the pin 313 is disposed on a predetermined contact pad of the circuit board 4 (see FIG. 4) that has been previously coated with solder paste. As such, the surface mount magnetic device 3 is placed on the circuit board 4. Then, the circuit board 3 and the surface mount magnetic device 4 are heated in a reflow furnace to melt the solder paste. Afterwards, the circuit board 4 is cooled to solidify the solder paste so as to securely attach the surface mount magnetic device 3 onto the circuit board 4. After the surface mount magnetic device 3 is mounted onto the circuit board 4, the surface mount magnetic device 3 is also electrically connected with the circuit board 4.

The planar cover 32 is placed over the first surface 311c of the magnetic element 31. In this embodiment, the planar cover 32 is a square plate with excellent toughness. It is preferred that the planar cover 32 is made of an insulating and heat-resistant material such as poly(ethylene terephthalate) (PET) or Mylar. The area of the top surface of the planar cover 32 is greater than the cross-sectional area of the nozzle 111 of the placement head 11 (see FIG. 4). Since the top surface of the planar cover 32 is flat, the nozzle 111 of the placement head 11 can tightly suck the top surface of the planar cover 32 due to vacuum suction. Moreover, since the planar cover 32 is made of an insulating and heat-resistant material, the arrangement of the planar cover 32 can increase the safety distance of the magnetic element 31.

Please refer to FIG. 3A again. In some embodiments, a first mark 33 is labeled on the top surface of the planar cover 32 in order to indicate some important information (e.g. the model number). For example, the first mark 33 is a text sign "AA-0001", which is labeled on the top surface 321 of the planar cover 32 by handwriting or printing to indicate the model number of the surface mount magnetic device 3. According to the first mark 33, the manufacturer can recognize the surface mount magnetic device 3. The first mark 33 is not restricted to the text signal. For example, the first mark 33 may be a color sign or a symbol sign labeled on the top surface 321 of the planar cover 32. Alternatively, the first mark 33 may be a cut corner or a notch formed in an edge side of the planar cover 32 in order for the manufacturer to recognize the surface mount magnetic device 3.

In some embodiments, a second mark 34 and a third mark 35 are further formed on the top surface 321 of the planar cover 32. For example, the second mark 34 is used for indicating a pin position of a specified pin 313; and the third mark 35 is used for indicating a polarity of the surface mount magnetic device 3. Each of the second mark 34 and the third mark 35 may be a text sign, a color sign or a symbol sign labeled on the top surface 321 of the planar cover 32, or a cut corner or a notch formed in an edge side of the planar cover 32. As shown in FIG. 3A, the second mark 34 is a cut corner formed in an edge side of the planar cover 32, and the third mark 35 is a dot sign labeled on the top surface 321 of the planar cover 32. In other words, the first mark 33, the second mark 34 and the third mark 35 are used for indicating the model number, the pin number and the polarity of the surface mount magnetic device 3, respectively. According to the first mark 33, the second mark 34 and the third mark 35, the manufacturer can recognize some important information associated with the surface mount magnetic device 3 in order to reduce the material confusion problem. As a consequence, the sequential operations of the production line become more efficient and convenient.

Figure 4:
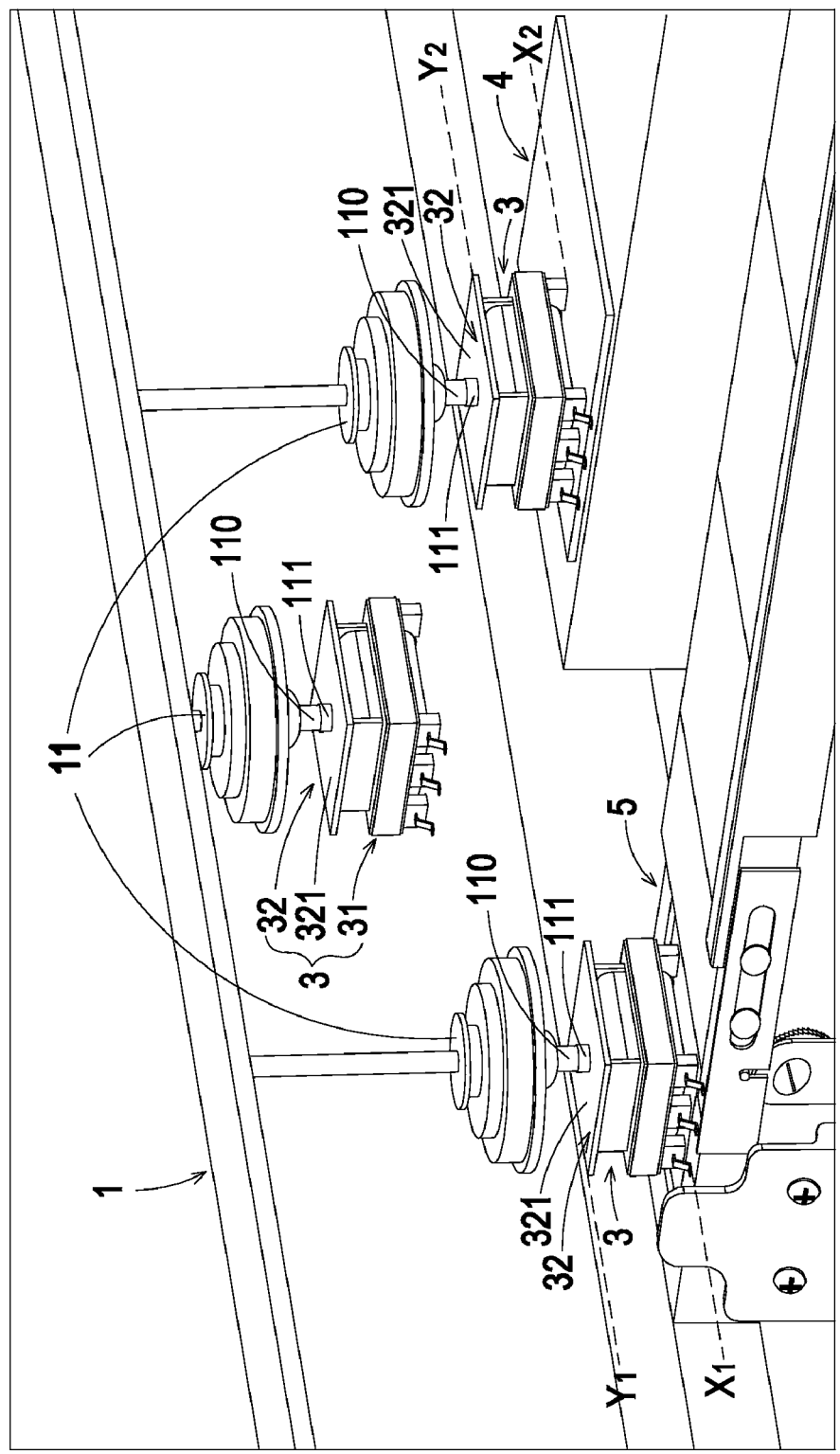
FIG. 4 is a schematic view illustrating an automatic placement machine for placing a surface mount magnetic device on a circuit board according to the present invention.

FIG. 4 is a schematic view illustrating an automatic placement machine for placing a surface mount magnetic device on a circuit board according to the present invention. Hereinafter, a process of placing the surface mount magnetic device 3 on a circuit board 4 according to a surface mount technology (SMT) will be illustrated with reference to FIG. 3B and FIG. 4. First of all, a magnetic element 31 is provided. The magnetic element 31 includes a winding structure 311 and two magnetic cores 312. Next, the planar cover 32 is attached on the first surface 311c of the magnetic element 31 via an insulating and heat-resistant adhesive (not shown), thereby producing the surface mount magnetic device 3. Next, some important information associated with the surface mount magnetic device 3 (e.g. the model number, the pin number and the polarity of the surface mount magnetic device 3) may be formed on the top surface 321 of the surface mount magnetic device 3. Next, the surface mount magnetic device 3 is transported to a first position X1 by a feeding machine 5. Next, the placement head 11 of the placement machine 1 is moved to a third position Y1 such that the nozzle 111 at the tip of the placement head 11 is contacted with the top surface 321 of the planar cover 32. Since the planar cover 32 has a flat top surface 321, the nozzle 111 of the placement head 11 is tightly attached on the top surface 321 of the planar cover 32. The tube 110 is communicated with a driving device such as a vacuum pump (not shown). Due to pneumatic suction of the vacuum pump, the nozzle 111 can vacuum suck the top surface 321 of the planar cover 32. Next, the surface mount magnetic device 3 is picked by the placement head 11 and moved from the third position Y1 to a fourth position Y2. Next, the vacuum pump inhales air to the tube 110 such that the surface mount magnetic device 3 is detached from the nozzle 111. As such, the surface mount magnetic device 3 is placed on the placed on predetermined locations of the circuit board 4 that have been previously coated with solder paste. In other words, the surface mount magnetic device 3 is moved from the fourth position Y2 to a second position X1. Since the planar cover 32 has a flat top surface 321, a vacuum seal condition is created between the top surface 321 of the planar cover 32 and the nozzle 110 and the nozzle 110 of the placement head 11 can vacuum suck up the surface mount magnetic device 3. Under this circumstance, the component disposal problem is overcome.

Figure 5A:
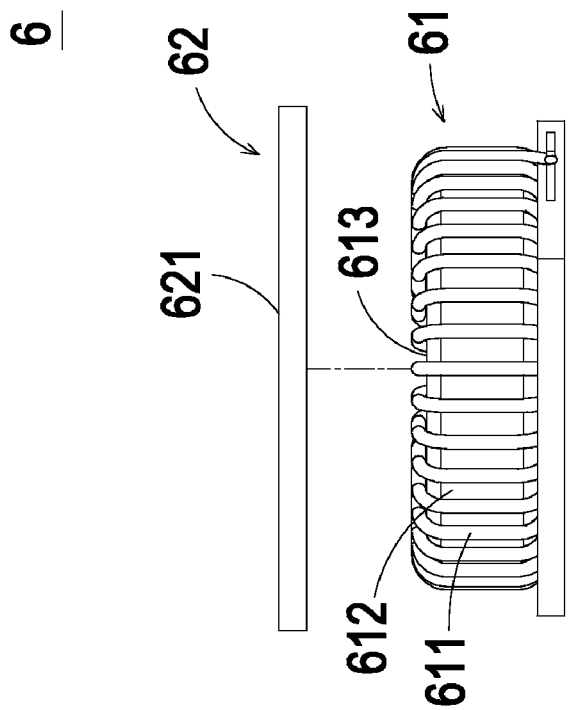
FIG. 5A is a schematic top view illustrating a surface mount magnetic device according to a second embodiment of the present invention.
Figure 5B:
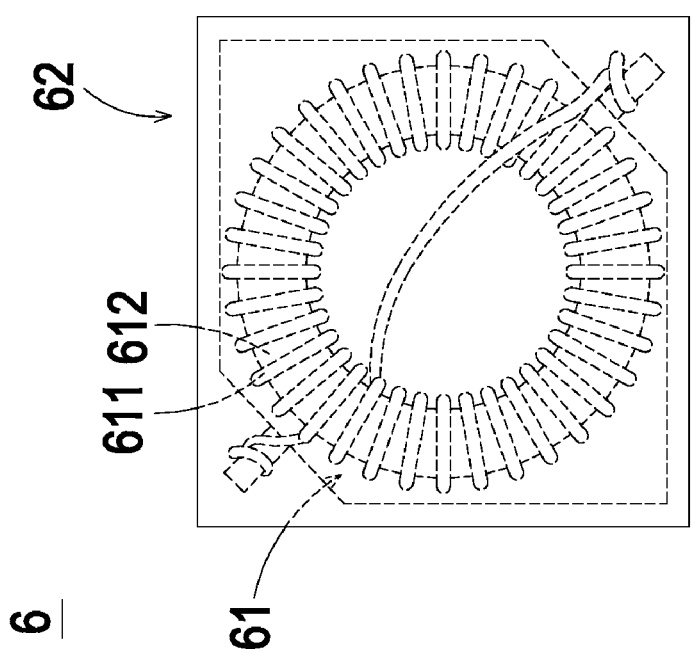
FIG. 5B is a schematic cross-sectional view of the surface mount magnetic device according to the second embodiment of the present invention.

FIG. 5A is a schematic top view illustrating a surface mount magnetic device according to a second embodiment of the present invention. FIG. 5B is a schematic cross-sectional view of the surface mount magnetic device according to the second embodiment of the present invention. The surface mount magnetic device 6 principally comprises a magnetic element 61 and a planar cover 62. The magnetic element 61 includes a magnetic core 612 and a coil 611 (e.g. a copper wire) wound on the magnetic core 612. The planar cover 62 is attached on the magnetic element 61. The planar cover 62 is placed over the first surface 613 of the magnetic element 61. Since the top surface 621 of the planar cover 62 is flat, the nozzle 111 of the placement head 11 can tightly suck the top surface 621 of the planar cover 62 due to vacuum suction.

An example of the magnetic element of the present invention includes but is not limited to a transformer, an inductor or a toroidal inductor.

From the above embodiment, the surface mount magnetic device of the present invention includes a magnetic element and a planar cover attached on the magnetic element. Since the planar cover has a flat top surface, a vacuum seal condition between the flat top surface and the nozzle of the placement head of the placement machine is created. Due to pneumatic suction of a driving device, the surface mount magnetic device is vacuum picked up by the placement head and thus the surface mount magnetic device is transported from a first position to a second position. By using the surface mount magnetic device of the present invention, the component disposal problem is largely reduced. Moreover, since the planar cover is made of an insulating and heat-resistant material, the safety distance of the surface mount magnetic device is increased. Since the planar cover has a flat top surface, one or more marks can be formed on the top surface of the planar cover. According to the marks, some important information associated with the surface mount magnetic device (e.g. model number, pin position and polarity) can be recognized by the manufacturer and thus the material confusion problem will be reduced. As a consequence, the sequential operations of the production line become more efficient and convenient.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A surface mount magnetic device to be picked up by a placement machine according to a surface mount technology, said surface mount magnetic device comprising:
    a magnetic element including a winding structure and a magnetic core; and
    a planar cover attached on said magnetic element, wherein said planar cover is attached on said magnetic element via an insulating and heat-resistant adhesive, and when a nozzle at a tip of a placement head of said placement machine is placed on a top surface of said planar cover, said nozzle is tightly attached on said top surface of said planar cover, and said surface mount magnetic device is vacuum picked up by said placement head due to pneumatic suction of a driving device, so that said surface mount magnetic device is transported from a first position to a second position.

2. The surface mount magnetic device according to claim 1 wherein said planar cover is an insulating and heat-resistant plate.

3. The surface mount magnetic device according to claim 1 wherein a first mark is formed on said top surface of said planar cover for indicating a model number of said surface mount magnetic device.

4. The surface mount magnetic device according to claim 3 wherein said first mark is a sign or a notch.

5. The surface mount magnetic device according to claim 1 wherein said magnetic element further includes a pin to be electrically connected with a circuit board.

6. The surface mount magnetic device according to claim 5 wherein a second mark is formed on said top surface of said planar cover for indicating a pin position of said pin.

7. The surface mount magnetic device according to claim 6 wherein said second mark is a sign or a notch.

8. The surface mount magnetic device according to claim 1 wherein a third mark is formed on said top surface of said planar cover for indicating a polarity of said surface mount magnetic device.

9. The surface mount magnetic device according to claim 8 wherein said third mark is a sign or a notch.

10. The surface mount magnetic device according to claim 1 wherein said magnetic element is a transformer, an inductor or a toroidal inductor.

* * * * *